(12) United States Patent
Palmer

(10) Patent No.: US 10,877,896 B2
(45) Date of Patent: Dec. 29, 2020

(54) ADAPTIVE READAHEAD CACHE MANAGER BASED ON DETECTED ACTIVE STREAMS OF READ COMMANDS

(71) Applicant: Micron Technology, Inc., Boise, ID (US)

(72) Inventor: David A. Palmer, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/296,044

(22) Filed: Mar. 7, 2019

(65) Prior Publication Data
US 2020/0285582 A1  Sep. 10, 2020

(51) Int. Cl.
| | | |
|---|---|---|
| G06F 12/0862 | (2016.01) | |
| G06F 12/0871 | (2016.01) | |
| G11C 5/04 | (2006.01) | |
| G06F 12/0868 | (2016.01) | |
| G06F 3/06 | (2006.01) | |

(52) U.S. Cl.
CPC ........ *G06F 12/0871* (2013.01); *G06F 3/0659* (2013.01); *G06F 12/0868* (2013.01); *G11C 5/04* (2013.01); *G06F 12/0862* (2013.01)

(58) Field of Classification Search
None
See application file for complete search history.

(56) References Cited

U.S. PATENT DOCUMENTS

| | | | | |
|---|---|---|---|---|
| 8,732,406 B1 * | 5/2014 | Pase | ................... | G06F 12/0862 711/137 |
| 2005/0195635 A1 | 9/2005 | Conley et al. | | |
| 2008/0005481 A1 | 1/2008 | Walker | | |
| 2011/0040941 A1 * | 2/2011 | Diefendorff | ........ | G06F 12/0862 711/137 |
| 2012/0166733 A1 * | 6/2012 | Cherukuri | ........... | G06F 12/0862 711/137 |
| 2012/0331222 A1 | 12/2012 | Jibbe et al. | | |
| 2014/0351527 A1 | 11/2014 | Traut et al. | | |

FOREIGN PATENT DOCUMENTS

KR  10-2014-0102709 A  8/2014

OTHER PUBLICATIONS

International Search Report and Written Opinion, PCT App. No. PCT/US2020/020485, dated Jun. 29, 2020, 12 pages.

* cited by examiner

*Primary Examiner* — Brian R Peugh
(74) *Attorney, Agent, or Firm* — Nicholson De Vos Webster & Elliott LLP

(57) ABSTRACT

A method for managing a readahead cache in a memory subsystem based on one or more active streams of read commands is described. The method includes receiving a read command that requests data from a memory component and determining whether the read command is part of an active stream of read commands based on a comparison of a set of addresses of the read command with one or more of (1) a command history table, which stores a set of command entries that each correspond to a received read command that has not been associated with an active stream, or (2) an active stream table, which stores a set of stream entries that each corresponds to active streams of read commands. The method further includes modifying a stream entry in the set of stream entries in response to determining that the read command is part of an active stream.

20 Claims, 11 Drawing Sheets

| STARTING LBA 404 | ENDING LBA 406 | MOST RECENT COMMAND SIZE 408 | DIRECTION 410 | LAST MODIFIED INDICATION 412 | READAHEAD CACHE ALLOCATION 414 | COMMAND COUNT 416 |
|---|---|---|---|---|---|---|
| | | | | | | |
| | | | | | | |
| | | | | | | |
| | | | | | | |

ACTIVE STREAM TABLE 400

ADAPTIVE READAHEAD CACHE MANAGER BASED ON DETECTED ACTIVE STREAMS OF READ COMMANDS

TECHNICAL FIELD

The present disclosure generally relates to a readahead cache manager, and more specifically, relates to an adaptive readahead cache manager based on detected active streams of read commands.

BACKGROUND ART

A memory subsystem can be a storage system, such as a solid-state drive (SSD), or a hard disk drive (HDD). A memory subsystem can be a memory module, such as a dual in-line memory module (DIMM), a small outline DIMM (SO-DIMM), or a non-volatile dual in-line memory module (NVDIMM). A memory subsystem can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 illustrates an active stream table, in accordance with some embodiments of the present disclosure.

DETAILED DESCRIPTION

Figure 1:
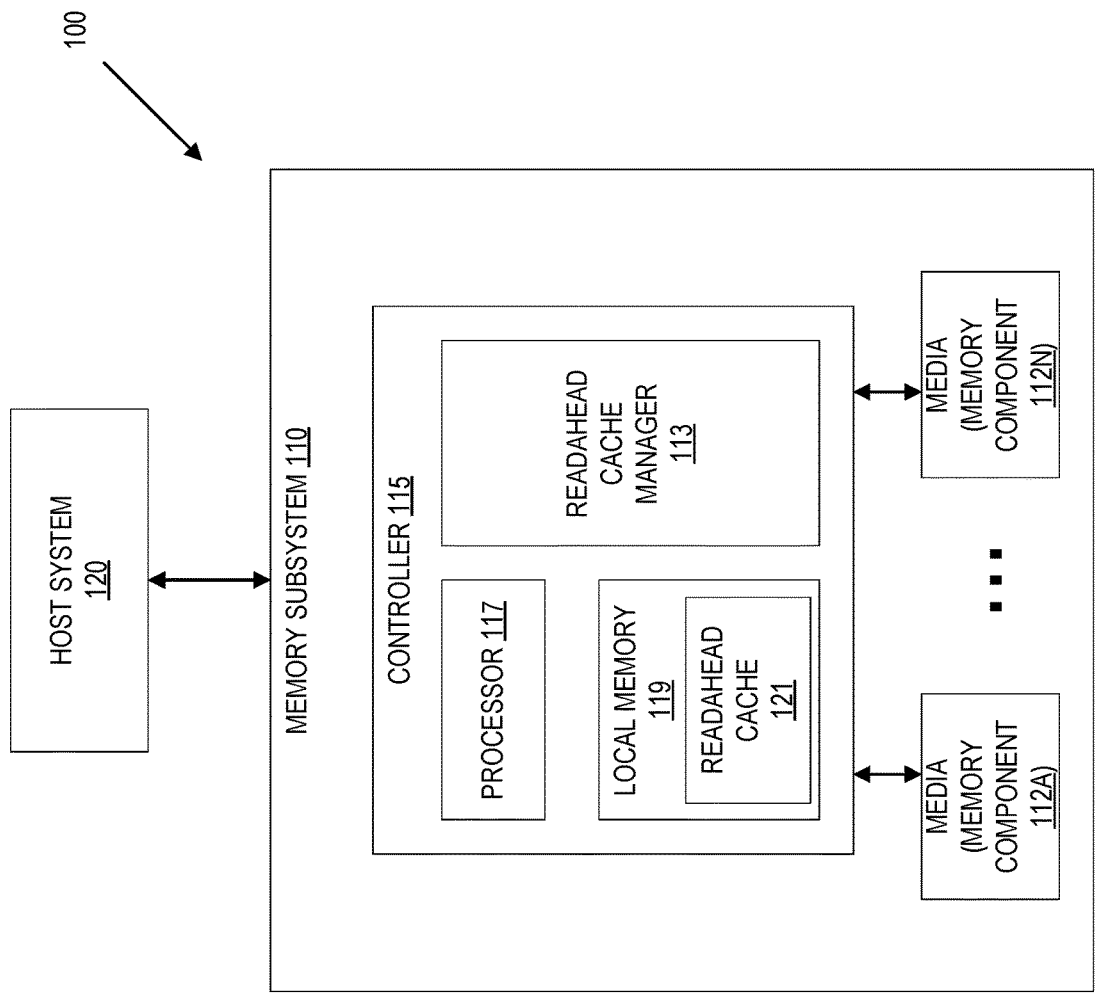
FIG. 1 illustrates an example computing environment that includes a memory subsystem, in accordance with some embodiments of the present disclosure.

Aspects of the present disclosure are directed to readahead cache manager in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

A readahead cache is a component in some memory subsystems and serves as a smaller and quicker/lower latency memory in comparison to larger and slower/high latency media of the memory subsystems. In these memory subsystems, the readahead cache attempts to (1) predict the next piece of data that a host system will request to read based on previous read commands (sometimes referred to as read requests) and (2) fetch this predicted, next piece of data from media before the memory subsystem receives a corresponding read command from the host system. When the prediction is successful (i.e., the readahead cache predicts and prefetches a piece of data from media and the host system thereafter requests this piece of data), the improvement in read performance is high because the memory subsystem can fulfill the requests directly from the readahead cache and without waiting to access media (i.e., the access to media is already performed by the time the read command is received by the memory subsystem). By definition, random read workloads (i.e., read commands that do not request access to sequentially addressed portion of media) cannot be predicted. Thus, readahead caches are effective on read workloads that include some amount of sequential reading such that the readahead cache can retrieve/store an accurate prediction. Despite the potential benefits, some memory subsystems do not include readahead caches because of (1) limited memory resources in the memory subsystems that can be devoted to a readahead cache and/or (2) poor performance of readahead caches based on an inability to accurately predict targets of new read commands.

Aspects of the present disclosure address the above and other deficiencies by providing a readahead cache manager that optimizes the use of a limited amount of memory for a readahead cache by tracking active read command streams from a host system. By tracking active read command streams (i.e., streams of read commands that are requesting access to sequential portions of media), the readahead cache manager can intelligently fill the readahead cache with data corresponding to these streams. In particular, the readahead cache manager manages (1) an active stream table, which tracks active sequential streams of read commands and (2) a command history table, which tracks recent read commands that have not yet been associated/added to an active stream in the active stream table but could be associated/added in the future based on subsequently received read commands. For example, upon receipt of a read command from a host system, a set of addresses of the read command are compared against starting and ending addresses of active streams in the active stream table. Upon determining that the set of addresses of the read command are sequential with a starting or ending address of an active stream in the active stream table, the active stream is updated (e.g., a starting address or ending address is updated with an address of the read command). Accordingly, the stream now represents the received read command along with any other read commands previously represented by the stream. Conversely, upon determining that the set of addresses of the read command are not sequential with a starting or ending address of an active stream in the active stream table, the set of addresses of the read command are compared with sets of addresses of prior read commands in the command history table. In response to determining that the set of addresses of the read command are sequential with a set of addresses of a read command in the command history table, a new active stream is added to the active stream table using the existing read command in the command history table and the received read command. However, in response to determining that the set of addresses of the read command are nonsequential with a set of addresses of a read command in the command history table, an entry is added to the command history table for the received read command such that the read command can be potentially used for inclusion in an active stream based on a later received read command. Each of the active stream table and the command history table are limited in size, and the readahead cache manager governs evictions to maintain recently received read commands present in the command history table and recently updated/ active streams present in the active stream table. Further, the readahead cache manager populates the readahead cache from media based on active streams in the active stream table. Since the active streams represent recently received, sequentially addressed read commands, populating the readahead cache based on active streams provides an intelligent prediction for potential future read commands/requests. Namely, the readahead cache can be populated with data from addresses in media adjacent or otherwise in close proximity to starting and ending addresses of the active streams. Further, the amount of space allocated to each stream and the data used to populate the readahead cache can be set based on other characteristics of the streams, including a most recent command size used to modify each stream, a direction each stream is expanding, a last modification indication for each stream, and a command count represented by each stream. As a result, even with a limited readahead cache, performance gains based on accurate data predictions can be realized in the memory subsystem.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/ storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device)

117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, a readahead cache 121, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. Although the controller 115 can fulfill commands directly from the memory components 112A to 112N, in some embodiments, the controller 115, with assistance from the readahead cache manager 113, can fulfill read commands using the readahead cache 121, which the readahead cache manager 113 populates with data from the memory components 112A to 112N corresponding to detected active streams of read commands. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., the readahead cache 121) and address circuitry (e.g., a row decoder and a column decoder) that can receive an address from the controller 115 and decode the address to access the memory components 112A to 112N.

The memory subsystem 110 includes a readahead cache manager 113 that can intelligently allocate space for and populate the readahead cache 121. In some embodiments, the controller 115 includes at least a portion of the readahead cache manager 113. For example, the controller 115 can include a processor 117 (processing device) configured to execute instructions stored in local memory 119 for performing the operations described herein. In some embodiments, the readahead cache manager 113 is part of the host system 120, an application, or an operating system.

Figure 2:
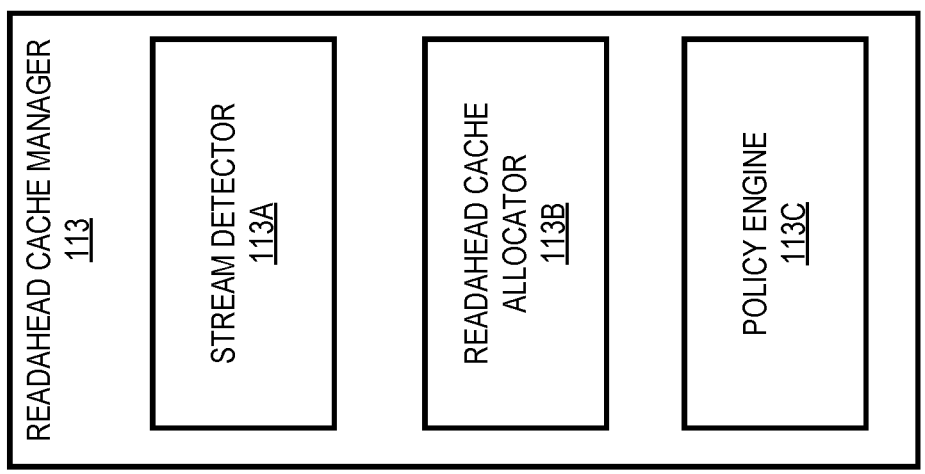
FIG. 2 illustrates a readahead cache manager, including a stream detector, a readahead cache allocator, and a policy engine, in accordance with some embodiments of the present disclosure.

The readahead cache manager 113 can intelligently allocate space and populate the readahead cache 121 (sometimes referred to as the lookahead cache 121) with data from the memory components 112A to 112N based on detected active streams of read commands. FIG. 2 is a component diagram of the readahead cache manager 113, according to one embodiment. As shown in FIG. 2, the readahead cache manager 113 can include (1) a stream detector 113A for detecting active streams of read commands using one or more of an active stream table and a command history table, (2) a readahead cache allocator 113B for determining allocation requests in the readahead cache 121 for each active stream, and (3) a policy engine 113C for modifying allocation requests based on an active policy when the allocation requests from the readahead cache allocator 113B exceed a capacity of the readahead cache 121. Further details with regards to the operations of the readahead cache manager 113 are described below.

Figure 3A:
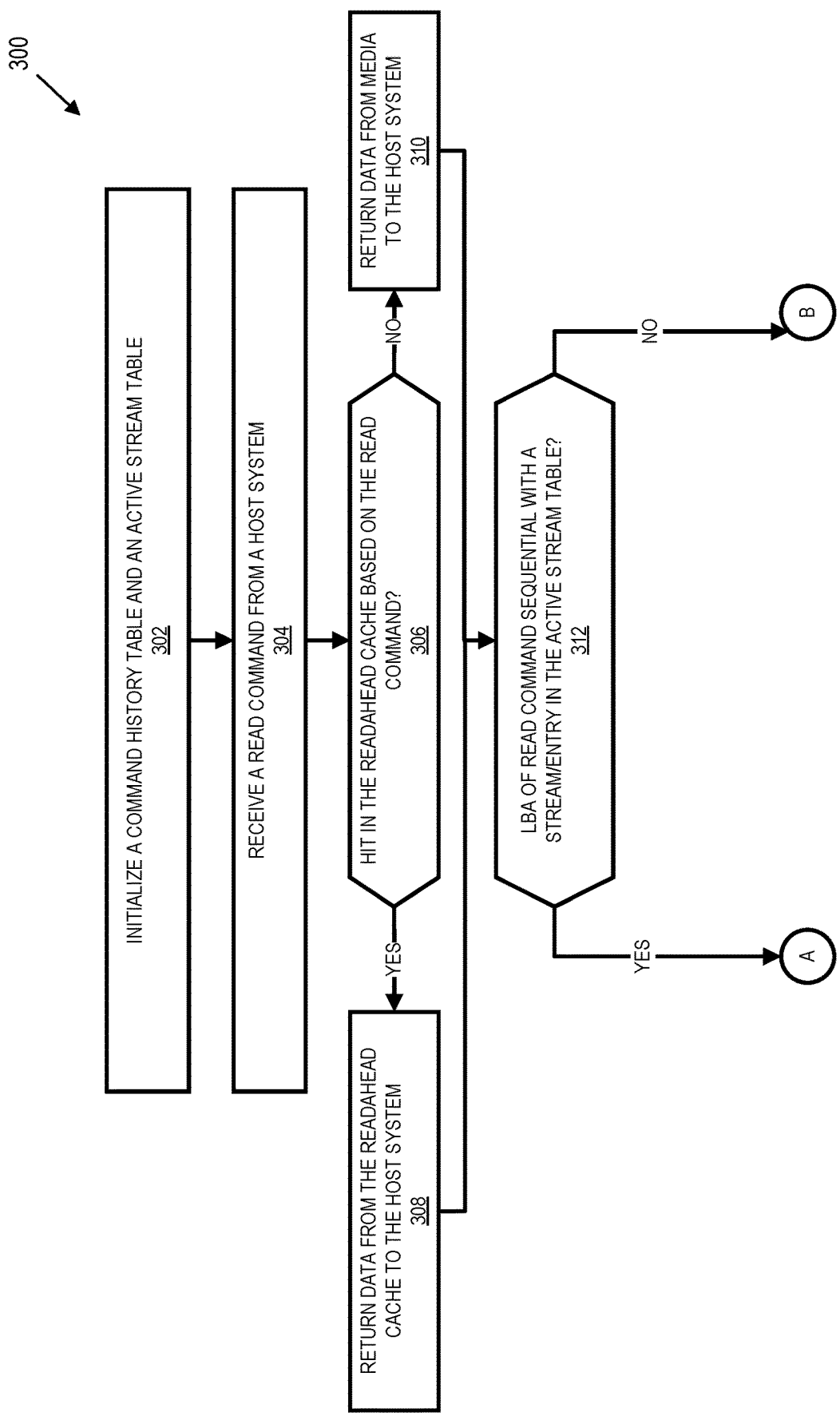
FIGS. 3A-3C is a flow diagram of an example method to manage a readahead cache based on detected active streams of read commands, in accordance with some embodiments of the present disclosure.
Figure 3B:
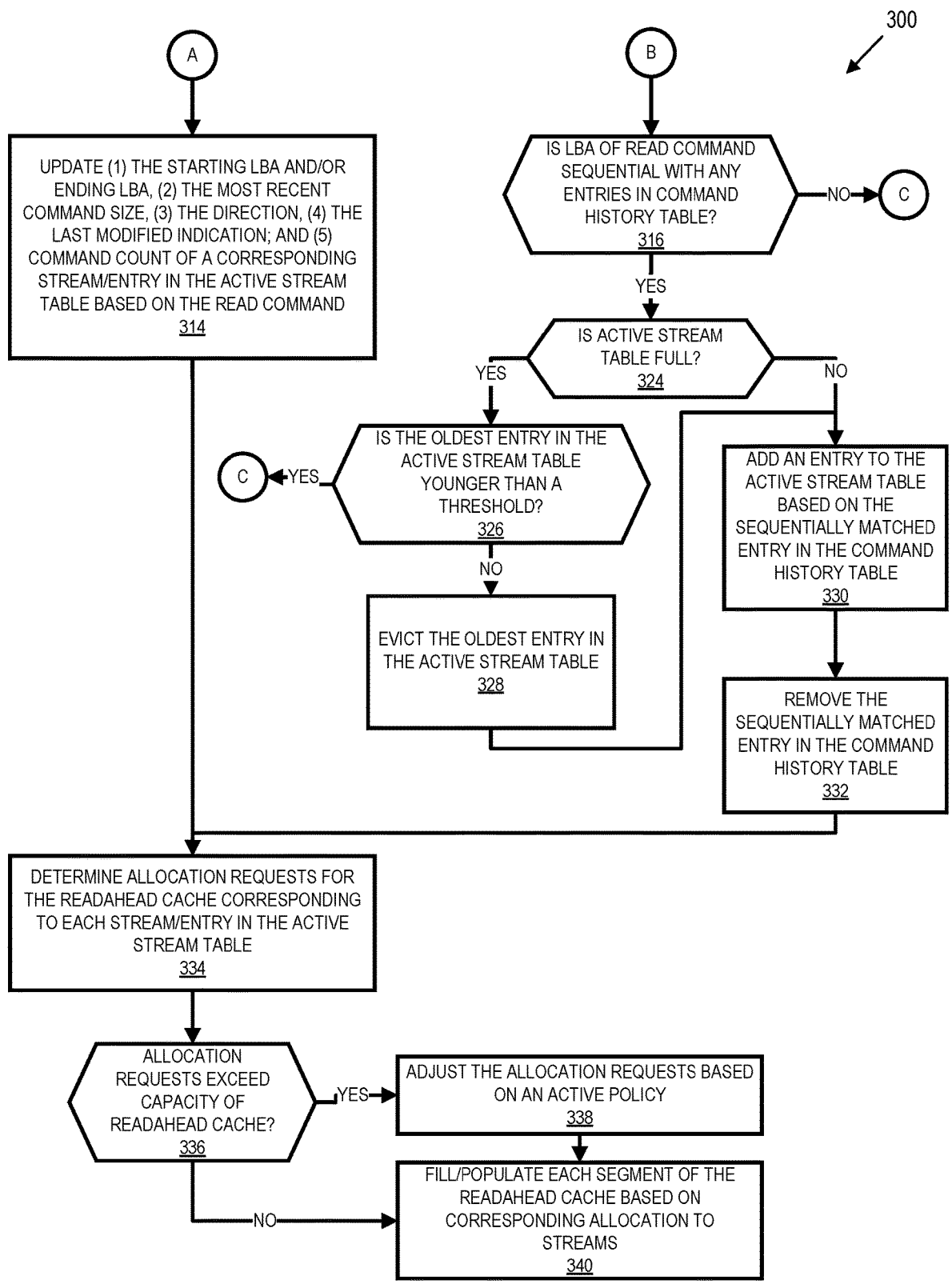
Figure 3C:
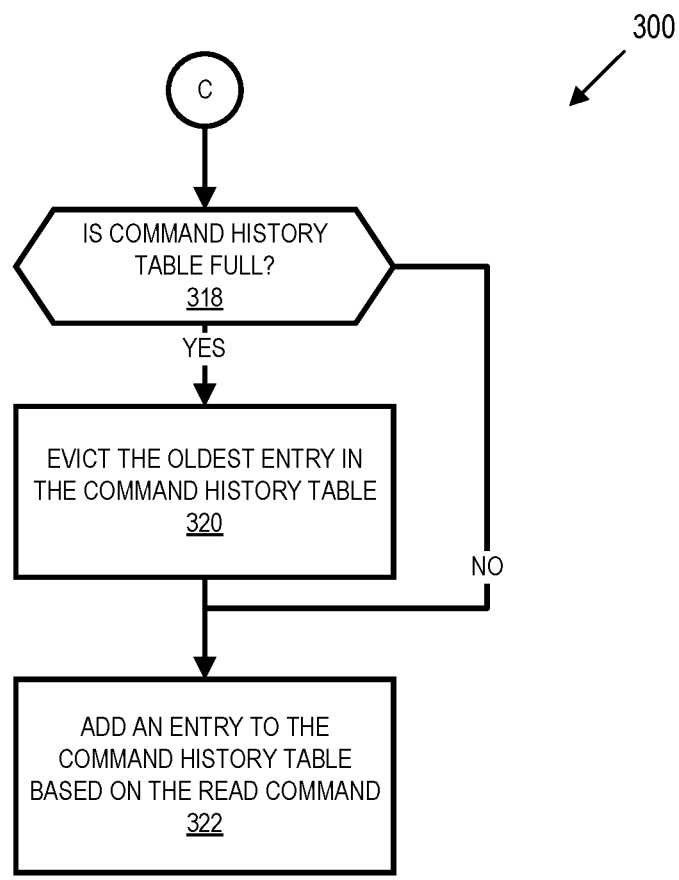

FIGS. 3A-3C is a flow diagram of an example method 300 to manage a readahead cache 121 based on detected active streams of read commands, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the readahead cache manager 113 of FIG. 1, including one or more of the stream detector 113A, the readahead cache allocator 113B, and the policy engine 113C of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 302, the processing device initiates an active stream table and a command history table. For example, upon booting/powering-on the processing device, the processing device initiates an active stream table and a command history table. As will be described in greater detail herein, the active stream table tracks detected active streams of read commands while the command history table tracks received read commands that have not been associated with a stream but will be examined for possible inclusion with an existing active stream in the active stream table or used to create a new active stream for the active stream table. In one embodiment, the processing device can initiate the active stream table and the command history table at operation 302 by allocating memory for a predefined number of entries for each table in the local memory 119 or in another piece of memory.

Figure 5:
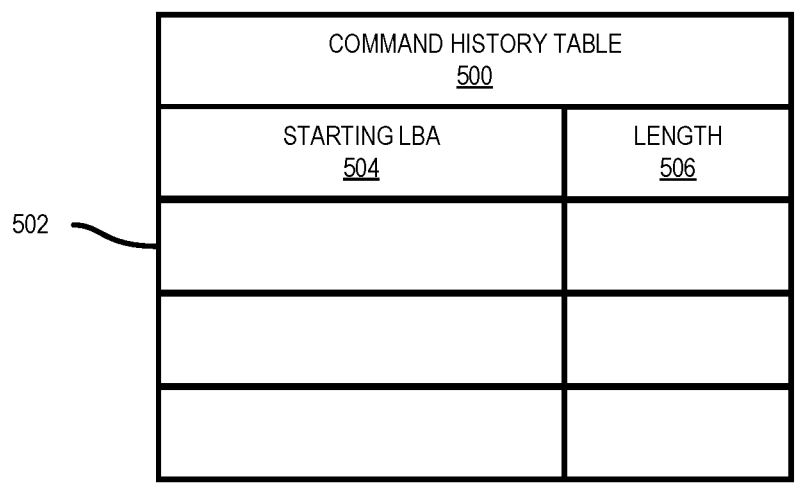
FIG. 5 illustrates a command history table, in accordance with some embodiments of the present disclosure.

FIG. 4 shows an active stream table 400 and FIG. 5 shows a command history table 500, according to one example embodiment. As shown in FIG. 4, the active stream table 400 includes a set of entries 402 (sometimes referred to as stream entries 402), which each correspond to a detected active stream of read commands, and each entry 402 includes (1) a starting logical block address (LBA) 404 that corresponds to a starting LBA in the memory components 112A to 112N for an active stream of the entry 402, (2) an ending LBA 406 that corresponds to an ending LBA in the memory components 112A to 112N for the active stream of the entry 402, (3) a most recent length 408 (sometimes referred to as a most recent command size 408 or most recent command length 408) that corresponds to a length (i.e., number of LBAs) in the last read command that was used to update the entry 402, (4) a direction 410 that indicates the direction the active stream of the entry 402 was most recently expanding (i.e., in response to a previous read command that was used to update the entry 402, whether the starting LBA 404 or the ending LBA 406 of the entry 402 was modified), (5) a last modified indication 412 that indicates a point in time the entry 402 was last modified, (6) a readahead cache allocation 414 that indicates the amount of space in the readahead cache 121 allocated to the active stream of the entry 402, and (7) a command count 416 that indicates the number of read commands that are currently represented in the active stream of the entry 402.

In some embodiments, the active stream table 400 has a predefined number of entries 402 and as new entries 402 are determined to be added to the active stream table 400, an oldest entry 402 is evicted from the active stream table 400. In particular, an entry with the oldest last modified indication 412 is evicted from the active stream table 400 as will be described in greater detail below. Although described herein as the processing device using the last modification indication 412 of entries 402 in the active stream table 400 as an indication of potential future use, in other embodiments the processing device can use other indicators of potential future use to guide evictions of entries 402 from the active stream table 400. For example, the processing device can record in entries 402 of the active stream table 400 when corresponding data in the readahead cache 121 has been used to fulfill a memory request. In this embodiment, the processing device can utilize this use indication of data in the readahead cache 121 to guide evictions of corresponding entries 402 from the active stream table 400.

As used herein, an active stream of read commands indicates a sequential/contiguous set of read commands (i.e., the set of addresses of a first read command of an active stream is sequential/contiguous with the set of addresses of a second read command of the active stream) for which a read command was recently received (e.g., a read command in the set of read commands for an active stream was recently received, such that a corresponding entry 402 has not been evicted from the active stream table 400 as per an eviction policy of the active stream table 400).

As shown in FIG. 5, the command history table 500 can include a set of entries 502 that each include a starting LBA 504 and a length 506 (sometimes referred to as a command size 506 or a command length 506), and each entry 502 corresponds to a recently received read command from a host system 120. In particular, each read command includes a starting LBA 504, corresponding to an LBA in the memory components 112A to 112N, and a length 506, corresponding to a number of LBAs from the indicated starting LBA 504. In some embodiments, the command history table 500 can be implemented as a first-in-first-out (FIFO) data structure, such that the command history table 500 stores entries 502 for the most recently received read commands. In these embodiments, when the command history table 500 is full, an entry 502 for a newly received read command takes the place of the oldest entry 502 in the command history table 500 (i.e., the oldest entry 502 is evicted and an entry 502 for the newly received read command is added to the command history table 500).

For purposes of illustration, the example command history table 500 and active stream table 400 will be used to describe the method 300. In one embodiment, the processing device initiates the command history table 500 and the active stream table 400 at operation 302 with no entries 502 and 402, respectively, but the processing device has allocated space in the local memory 119 or in another piece of memory for addition of entries 502 and 402. In particular, the processing device allocates a fixed amount of space in the local memory 119 for the active stream table 400 and a fixed amount of space in the local memory 119 for the command history table 500. Thus, the active stream table 400 can support a fixed number of entries 402 and the command history table 500 can support a fixed number of entries 502 based on the fixed space in the local memory 119. The processing device allocates an amount of space for each of the active stream table 400 and the command history table 500 based on a defined or otherwise desired number of entries 402 and 502 in each table 400 and 500, respectively.

Figure 6:
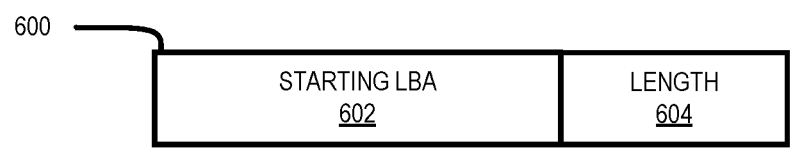
FIG. 6 illustrates an example read command, in accordance with some embodiments of the present disclosure.

At operation 304, the processing device receives a read command from a host system 120. For example, the host system 120 can determine the need for data stored in the memory components 112A to 112N and transmit a read command to controller 115 at operation 304. The read command includes a starting LBA and a length (i.e., a number of LBAs from the starting LBA) corresponding to LBAs in the memory components 112A to 112N. For example, FIG. 6 shows an example read command 600 that is received from a host system 120, according to one example embodiment. As shown in FIG. 6, the read command 600 includes a starting LBA 602 and a length 604. Although only shown with a starting LBA 602 and a length 604, the read command 600 can include additional pieces of information. For purposes of illustration, the example read command 600 of FIG. 6 will be used to describe the method 300.

At operation 306, the processing device determines whether the read command 600 results in a hit in the readahead cache 121. For example, when the readahead cache 121 includes data for the starting LBA 602 and a sequential set of LBAs of the length 604 indicated in the read command 600, the processing device determines a hit in the readahead cache 121 at operation 306. In response to the processing device determining a hit at operation 306, the method 300 moves to operation 308.

At operation 308, the processing device returns data to the host system 120 from the readahead cache 121 based on the hit in the readahead cache 121 for the read command 600. In particular, the processing device returns the data from the starting LBA 602 and a sequential set of LBAs, extending from the starting LBA 602, of the length 604 indicated in the read command 600 to the host system 120. This returned data was previously cached/stored in the readahead cache 121 based on a detected active stream as will be described in greater detail below. Since the data stored in the readahead cache 121 is now being utilized (e.g., the data in the readahead cache 121 becomes useful/live data for the host system 120), a performance gain is realized by the host system 120 and/or the processing device (e.g., the memory sub-system 110). Namely, the host system 120 and the processing device do not need to wait for data to be read from the memory components 112A to 112N to fulfill the read command 600.

Returning to operation 306, in response to the processing device determining a miss in the readahead cache 121, the method 300 moves to operation 310. At operation 310, the processing device returns data from the memory components 112A to 112N to the host system 120 based on the read command 600. In particular, the processing device returns data from the starting LBA 602 and a sequential set of LBAs, extending from the starting LBA 602, of the length 604 indicated in the read command 600 to the host system 120.

In some embodiments, a hit can be determined at operation 306 when only some of the data requested by the read command 600 is present in the readahead cache 121. In these embodiments, the method 300 can move to operation 310 following operation 308 such that the processing device can return the remaining data from the memory components 112A to 112N to the host system 120.

Figure 7:
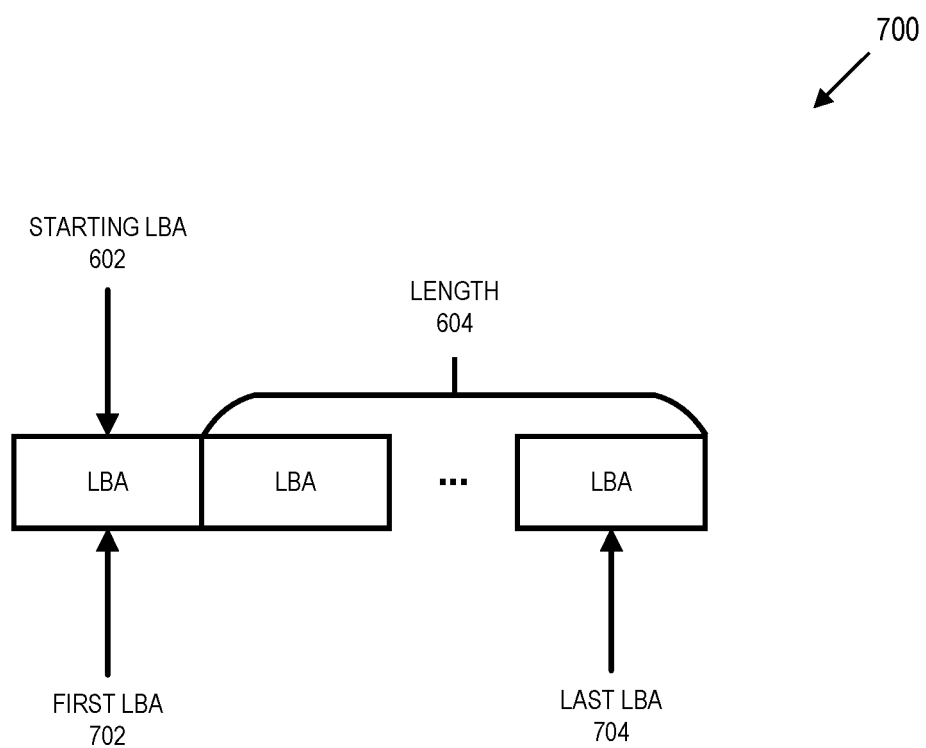
FIG. 7 illustrates a set of read command logical block addresses (LBAs), in accordance with some embodiments of the present disclosure.

Following either operation 308 (i.e., returning data from the readahead cache 121 to the host system 120) or operation 310 (i.e., returning data from the memory components 112A to 112N to the host system 120), the method 300 moves to operation 312. At operation 312, the processing device determines if an LBA of the received read command 600 immediately precedes or succeeds a stream/entry 402 in the active stream table 400 (i.e., the processing device determines if the read command 600 is sequential with a stream/entry 402 in the active stream table 400). In particular, as described above, the read command 600 indicates a set of sequential LBAs. For example, FIG. 7 shows a set of read command LBAs 700 that begin with the starting LBA 602 of the read command 600 and extend for the length 604 of the read command 600. As shown, the set of read command LBAs 700 include a first LBA 702 (i.e., the starting LBA 602 of the read command 600) and a last LBA 704. The set of read command LBAs 700 will be used for further explaining the method 300.

At operation 312, the processing device determines (1) if the last LBA 704 in the set of read command LBAs 700 immediately precedes a starting LBA 404 for a stream/entry 402 in the active stream table 400 or (2) if the first LBA 702 in the set of read command LBAs 700 immediately succeeds an ending LBA 406 for a stream/entry 402 in the active stream table 400. When the processing device determines at operation 312 that an LBA of the received read command 600 (i.e., the set of read command LBAs 700) immediately precedes or succeeds a stream/entry 402 in the active stream table 400, the method 300 moves to operation 314.

At operation 314, the processing device updates one or more streams/entries 402 in the active stream table 400 based on determining that an LBA of the received read command 600 immediately precedes or succeeds a stream/entry 402 in the active stream table 400 (i.e., the set of read command LBAs 700 are sequential with a stream/entry 402). For example, when the processing device determines at operation 312 that the last LBA 704 in the set of read command LBAs 700 immediately precedes a starting LBA 404 for a stream/entry 402 in the active stream table 400, the processing device updates the starting LBA 404 for that entry 402 to be equal to the first LBA 702 in the set of read command LBAs 700. When the processing device determines at operation 312 that the first LBA 702 in the set of read command LBAs 700 immediately succeeds an ending LBA 406 for a stream/entry 402 in the active stream table 400, the processing device updates the ending LBA 406 for that stream/entry 402 to be equal to the last LBA 704 in the set of read command LBAs 700. In either case, the processing device also updates (1) the most recent command size 408 value for the entry 402 with the length 604 from the received read command 600, (2) the direction 410 for the entry 402 based on whether the starting LBA 404 or the ending LBA 406 was modified (e.g., when the processing device modified the starting LBA 404, the processing device modifies the direction 410 to indicate that the stream/entry 402 is growing in the direction of lower LBAs, and when the processing device modified the ending LBA 406, the processing device modifies the direction 410 to indicate that the stream/entry 402 is growing in the direction of higher LBAs), (3) the last modified indication 412 to indicate a time of the current modification to the stream/entry 402, and (4) the command count 416 by incrementing the command count 416 to represent the inclusion of the read command 600 received at operation 304 in the stream/entry 402.

In some embodiments, the processing device determines at operation 312 that the last LBA 704 in the set of read command LBAs 700 immediately precedes a starting LBA 404 for a first stream/entry 402 in the active stream table 400 and the first LBA 702 in the set of read command LBAs 700 immediately succeeds an ending LBA 406 for a second stream/entry 402 in the active stream table 400 (i.e., the set of read command LBAs 700 are sequential and join two streams/entries 402). In this scenario, the processing device combines the first and second streams/entries 402 at operation 314 into a single stream/entry 402 and discards/removes the remaining stream/entry 402 from the active stream table 400. In particular, the combined stream/entry 402 includes the smallest/lowest starting LBA 404 from the first and second streams/entries 402 as the starting LBA 404 for the combined entry 402 and the largest/highest ending LBA 406 from the first and second streams/entries 402 as the ending LBA 406 for the combined entry 402. For the combined entry 402, the processing device also updates (1) the most recent command size 408 value for the entry 402 with the length from the received read command 600, (2) the direction 410 for the stream/entry 402 to a default direction (e.g., increasing LBA's) since it is presently unclear as to which direction the stream is expanding, (3) the last modified indication 412 to indicate a time of the current modification to the combined stream/entry 402, and (4) the command count 416 by adding the command counts 416 from each of the first and second streams/entries 402 and incrementing the sum by one to account for the received read command 600.

Figure 8:
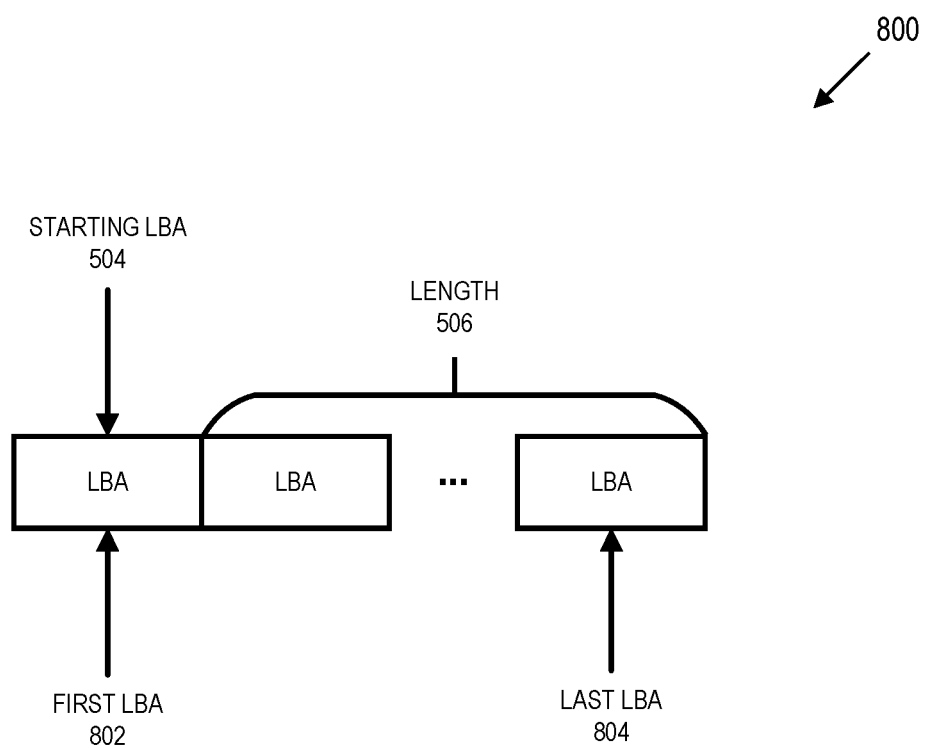
FIG. 8 illustrates a set of command history LBAs, in accordance with some embodiments of the present disclosure.

Returning to operation 312, when the processing device determines at operation 312 that an LBA of the read command 600 does not immediately precede or succeed a stream/entry 402 in the active stream table 400, the method 300 moves to operation 316. At operation 316, the processing device determines whether an LBA of the read command 600 is sequential with any entries 502 in the command history table 500. In particular, each entry 502 in the command history table 500 can include a set of command history LBAs, which include the starting LBA 504 for the entry 502 and sequentially extends from the starting LBA 504 to the length 506 for the entry 502. For example, FIG. 8 shows a set of command history LBAs 800 for an entry 502 that begin with the starting LBA 504 of the entry 502 and extend for the length 506 of the entry 502. As shown, the set of command history LBAs 800 include a first LBA 802 (i.e., the starting LBA 504 of the entry 502) and a last LBA 804. The set of command history LBAs 800 will be used for further explaining the method 300.

The processing device determines that an LBA of the read command 600 is sequential with an entry 502 in the command history table 500 when (1) a first LBA 702 in the set of read command LBAs 700 immediately succeeds the a last LBA 804 for the set of command history LBAs 800 of the entry 502 or (2) a last LBA 704 in the set of read command LBAs 700 immediately precedes the first LBA 802 for the set of command history LBAs 800 of the entry 502. When the processing device determines at operation 316 that an LBA of the read command 600 is not sequential with an entry 502 in the command history table 500, the processing device has not detected a new active stream of read commands and the method 300 moves to operation 318 to add an entry 502 in the command history table 500 for the read command 600.

At operation 318, the processing device determines if the command history table 500 is full. As noted above, the command history table 500 is of a fixed size (i.e., the command history table 500 is allocated a fixed amount of memory with a corresponding fixed number of entries 502). When the processing device determines at operation 318 that the command history table 500 is full (i.e., all the fixed number of entries 502 are being utilized for other read commands), the method 300 moves to operation 320.

At operation 320, the processing device evicts the oldest entry 502 in the command history table 500 such that the processing device can add a new entry 502 to the command history table 500 for the read command 600 received at operation 304. As noted above, the command history table 500 can be a FIFO structure such that the command history table 500 tracks the order in which entries 502 are added to the command history table 500 such that the processing device can remove the oldest entry 502 (i.e., via a pointer to the earliest entry 502 added to the command history table 500) at operation 320.

Either following operation 320 (i.e., when the command history table 500 is full) or following operation 318 (i.e., when the command history table 500 is not full), the processing device adds a new entry 502 at operation 322 to the command history table 500 for the read command 600 received at operation 304. This new entry 502 includes a starting LBA 504 set to the starting LBA 602 indicated in the read command 600 and a length 506 set to the length 604 indicated in the read command 600. Accordingly, the read command 600 is added to the command history table for possible later use in detecting a new active stream of read commands or modification of an existing active stream of read commands based on a subsequently received read command.

Returning to operation 316, when the processing device determines at operation 316 that an LBA of the read command 600 is sequential with an entry 502 in the command history table 500, the processing device has detected a new active stream of read commands and the method 300 moves to operation 324.

At operation 324, the processing device determines if the active stream table 400 is full. As noted above, the active stream table 400 is of a fixed size (i.e., the active stream table 400 is allocated a fixed amount of memory with a corresponding fixed number of entries 402). When the processing device determines that the active stream table 400 is full (i.e., all the fixed number of entries 402 of the active stream table 400 are being utilized for other active streams), the method 300 moves to operation 326.

At operation 326, the processing device determines if the oldest entry 402 in the active stream table 400 is younger than a predefined age threshold (i.e., the processing device compares the age threshold with last modified indications 412 of each entry 402). In particular, a comparison with an age threshold is utilized to ensure entries 402 in the active stream table 400 are not continually evicted from the active stream table 400 before corresponding data in the readahead cache 121 can have a chance to be utilized. If the processing device determines at operation 326 that the oldest entry 402 in the active stream table 400 is younger than a predefined age threshold, the method 300 moves to operation 318 such that the received read command 600 is added to the command history table 500.

Conversely, when the processing device determines at operation 326 that the oldest entry 402 in the active stream table 400 is older than a predefined age threshold, the method 300 moves to operation 328. At operation 328, the processing device evicts the oldest entry 402 in the active stream table 400. Since the evicted entry 402 is no longer in the active stream table 400, the processing device will not allocate space for the evicted entry 402 in the readahead cache 121 when the processing device allocates space in the readahead cache 121. Consequently, the processing device will not include data for the evicted entry 402 in the readahead cache 121.

Either following the processing device evicting the oldest entry 402 in the active stream table 400 at operation 328 or upon the processing device determining at operation 324 that the active stream table 400 is not full, the method 300 moves to operation 330. At operation 330, the processing device adds an entry 402 in the active stream table 400 for (1) the read command 600 received at operation 304 and (2) the entry 502 in the command history table 500 that the processing device determined was sequential with the read command at operation 316. In particular, the processing device adds an entry 402 to the active stream table 400 with (1) a starting LBA 404 for the entry 402 set equal to the lower/minimum of the first LBA 702 in the set of read command LBAs 700 and the first LBA 802 of the set of command history LBAs 800 for the entry 502 in the command history table 500 that the processing device determined was sequential with the read command 600; (2) an ending LBA 406 for the entry 402 set equal to the larger/maximum of the last LBA 704 in the set of read command LBAs 700 and the last LBA 804 of the set of command history LBAs 800 for the entry 502 in the command history table 500 that the processing device determined was sequential with the read command 600; (3) the most recent command size 408 value for the entry 402 with the length 604 from the received read command 600; (4) the direction 410 for the entry 402 based on whether the set of read command LBAs 700 are less than the set of command history LBAs 800 for the entry 502 in the command history table 500 that the processing device determined was sequential with the read command 600 (e.g., when the set of read command LBAs 700 are less than the set of command history LBAs 800 for the entry 502, the processing device sets the direction 410 to indicate that the stream/entry 402 is growing in the direction of lower LBAs and when the set of read command LBAs 700 are greater than the set of command history LBAs 800 for the entry 502, the processing device sets the direction 410 to indicate that the active stream for the entry 402 is growing in the direction of larger LBAs); (5) the last modified indication 412 to indicate a time of the current modification to the entry 402; and (6) the command count 416 is set to two, reflecting the read command 600 and the entry 502 in the command history table 500 that the processing device determined was sequential with the read command.

In some embodiments, the processing device can determine at operation 316 that the read command 600 is sequential with two entries 502 in the command history table 500. In these embodiments, both entries 502 are combined with the read command to form a single entry 402 in the active stream table 400 at operation 330.

At operation 332, the processing device removes the entry 502 (or entries 502) in the command history table 500 that the processing device determined at operation 316 was sequential with the read command 600. In particular, this entry 502 is removed from the command history table 500 as the corresponding read command is now represented by an active stream/entry 402 in the active stream table 400.

Either following operation 314 or operation 332, the processing device allocates segments of space in the readahead cache 121 to each stream/entry 402 in the active stream table 400 at operation 334. Consequently, previously evicted entries 402 will no longer include data in the readahead cache 121 in favor of other (possibly new) entries 402 from the active stream table 400. The segments of space in the readahead cache 121 are portions of the readahead cache 121 that can be used for storing data from the memory components 112A to 112N, as will be described below. The processing device can use one or more pieces of information in the active stream table 400 for allocating segments of space in the readahead cache 121. For example, the processing device can determine based on the most recent command size 408 for a stream/entry 402 whether to allocate a large or small segment of space for the stream/entry 402 (e.g., the processing device can allocate a larger segment of space in the readahead cache 121 for a first stream/entry 402 in comparison to a second stream/entry 402 when the first stream/entry 402 has a most recent command size 408 that is larger than a most recent command size 408 of the second stream/entry 402). In another example, the processing device can determine based on the last modified indication 412 for a stream/entry 402 whether to allocate a large or small segment of space for the stream/entry 402 (e.g., the processing device can allocate a larger segment of space in the readahead cache 121 for a first stream/entry 402 in comparison to a second stream/entry 402 when the first stream/entry 402 has a more recent last modified indication 412 than a last modified indication 412 of the second stream/entry 402). In yet another example, the processing device can determine based on the command count 416 for a stream/entry 402 whether to allocate a large or small segment of space for the stream/entry 402 (e.g., the processing device can allocate a larger segment of space in the readahead cache 121 for a first stream/entry 402 in comparison to a second stream/entry 402 when the first stream/entry 402 has a command count 416 that is larger than a command count 416 of the second stream/entry 402). In some embodiments, the processing device updates the readahead cache allocation 414 for each stream/entry 402 in the active stream table 400 based on the determined allocation at operation 334.

In one embodiment, the processing device determines the readahead cache allocation 414 for each entry 402 based on the most recent command size 408 for a stream/entry 402 and the command count 416 for the stream/entry 402. For example, the readahead cache allocation 414 for a stream/entry 402 can be the sum or product of the most recent command size 408 and the command count 416 for the stream/entry 402.

In some embodiments, if the read command 600 resulted in a hit in the readahead cache 121 at operation 306, the processing device can use characteristics of this hit to adjust the readahead cache allocation 414 for each entry 402 at operation 334. For example, when the hit is partially serviced by the readahead cache 121 (i.e., some data for the read command 600 was present in the readahead cache 121 but some data for the read command 600 was not present), the allocation for the corresponding stream/entry 402 can be increased to account for this shortfall. Conversely, when the hit does correspond to all data (i.e., all the data for the read command 600 was present in the readahead cache 121) but some data for the stream/entry 402 was not used/returned as it was not requested by the read command 600, the allocation for the corresponding stream/entry 402 can be decreased to account for this overshoot.

At operation 336, the processing device determines if the allocation from operation 334 exceeds the storage capacity of the readahead cache 121. In particular, the readahead cache 121 is a fixed/limited size and the allocation of segments from operation 334 could have exceeded the limited capacity of the readahead cache 121. In response to the processing device determining at operation 336 that the allocation from operation 334 exceeds the storage capacity of the readahead cache 121, the method 300 moves to operation 338.

At operation 338, the processing device adjusts the allocation requests based on a policy. For example, the processing device can use a fairness policy or round-robin policy to adjust allocation requests such that each stream/entry 402 in the active stream table 400 receives equal space in the readahead cache 121. In another example, the processing device can use a largest chunk size allocation policy to adjust the allocation requests. For example, the processing device can allocate space in the readahead cache 121 to streams/entries 402 with the largest initial allocation requests first or with the largest command count 416 first such that these streams/entries 402 are provided with maximum throughput. In yet another example, the processing device can use a smallest chunk size allocation policy to adjust the allocation requests. For example, the processing device can allocate space in the readahead cache 121 to streams/entries 402 with the smallest initial allocation requests first or with the smallest command count 416 first to provide space in the readahead cache 121 for as many streams/entries 402 as possible. In some embodiments, the processing device updates the readahead cache allocation 414 for each stream/entry 402 in the active stream table 400 based on the determined allocation update at operation 340.

Either following operation 336 (i.e., the allocation requests do not exceed the capacity of the readahead cache 121) or operation 338 (i.e., after adjustment of the allocation requests), the processing device fills/populates each segment of the readahead cache based on the allocation requests determined at operation 334, and possibly updated, at operation 340. For example, for each stream/entry 402 in the active stream table 400, the processing device retrieves data from the memory components 112A to 112N and stores the retrieved data in allocated segments of space in the readahead cache 121. The processing device can use one or more pieces of information from the active stream table 400 to fill/populate the readahead cache 121. For example, the processing device can determine based on the direction 410 of a stream/entry 402 whether to fill/populate allocated segments of the readahead cache 121 from LBAs of the memory components 112A to 112N that extend from the starting LBA 404 or the ending LBA 406.

As described above, the readahead cache manager 113 populates the readahead cache 121 from media (i.e., the memory components 112A to 112N) based on active streams/entries 402 in the active stream table 400. Since the active streams/entries 402 represent recently received, sequentially addressed read commands, populating the readahead cache 121 based on active streams/entries 402 provides an intelligent prediction for potential future read commands/requests. Namely, the readahead cache 121 can be populated with data from addresses in media adjacent or otherwise in close proximity to starting and ending addresses 404 and 406 of the active streams/entries 402. Further, the amount of space allocated to each active streams/entries 402 and the data used to populate the readahead cache 121 can be set based on other characteristics of the active streams/entries 402, including a most recent command size 408 used to modify each stream/entry 402, a direction 410 each stream/entry 402 is expanding, a last modification indication 412 for each stream/entry 402, and/or a command count 416 represented by each stream/entry 402. As a result, even with a limited readahead cache 121, performance gains based on accurate data predictions can be realized in the memory subsystem 110.

As described above, in some embodiments, the method 300 is performed by the readahead cache manager 113 of FIG. 1 (i.e., the processing device is the readahead cache manager 113), including one or more of the stream detector 113A, the readahead cache allocator 113B, and the policy engine 113C of FIG. 2. For example, operations 302-332 can be performed by the stream detector 113A, operation 334 by the readahead cache allocator 113B, and operations 336-338 by the policy engine 113C.

Figure 9:
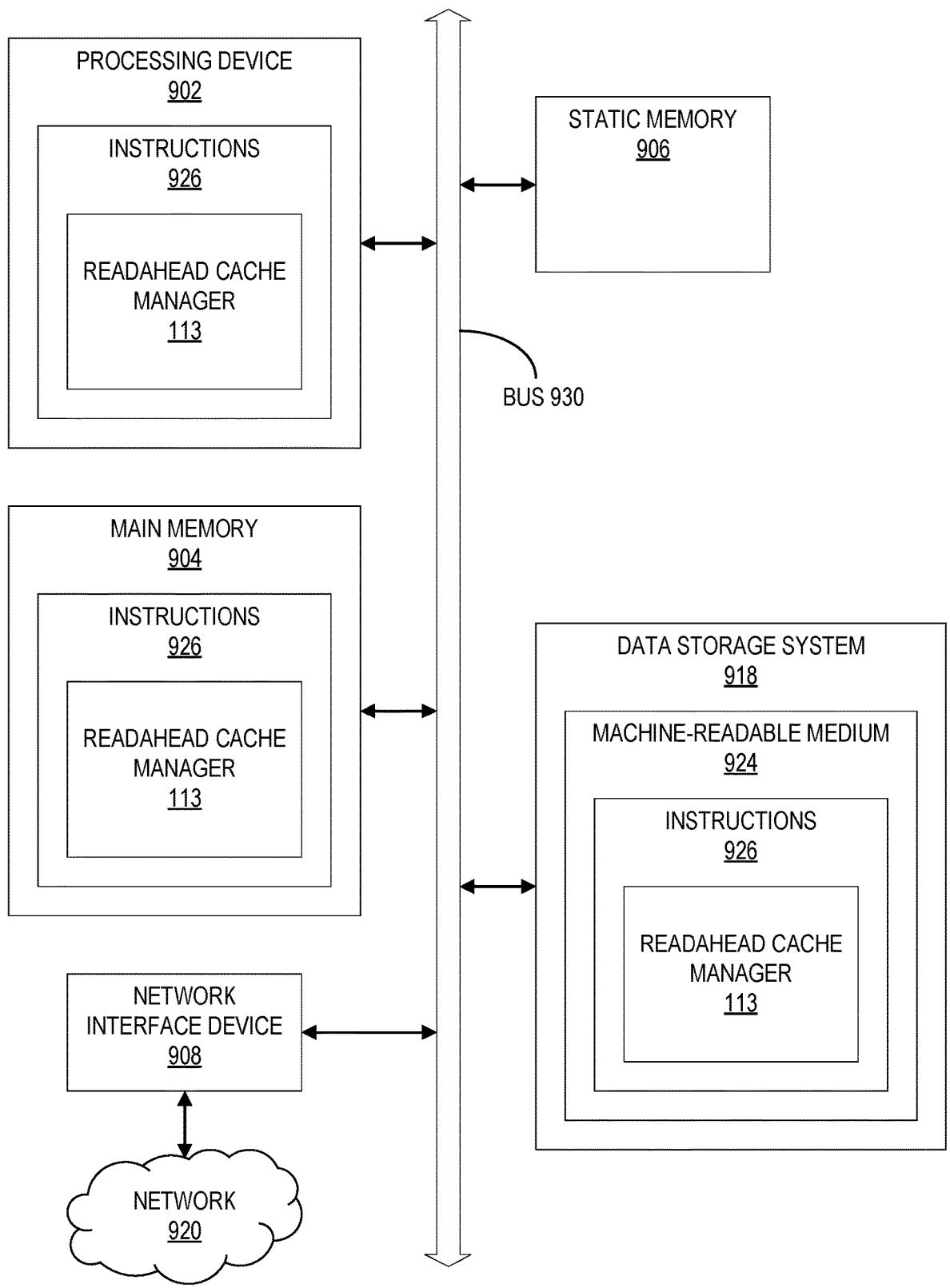
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the readahead cache manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory subsystem 110 of FIG. 1.

In one embodiment, the instructions 926 include instructions to implement functionality corresponding to a readahead cache manager (e.g., the readahead cache manager 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. For example, a computer system or other data processing system, such as the controller 115, may carry out the computer-implemented method 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method for managing a readahead cache in a memory subsystem based on one or more active streams of read commands, the method comprising:
   receiving, from a host system, a first read command that requests data from a memory component of the memory subsystem;
   determining whether the first read command is part of an active stream of read commands based on a comparison of a set of addresses of the first read command with (1) a command history table, which stores a set of command entries that each correspond to a received read command that has not been associated with an active stream of read commands, and (2) an active stream table, which stores a set of stream entries that each correspond to active streams of read commands detected by the memory subsystem; and
   modifying a stream entry in the set of stream entries in response to determining that the first read command is part of an active stream of read commands being tracked with the stream entry in the active stream table.

2. The method of claim 1, wherein determining whether the first read command is part of an active stream of read commands comprises:
   determining whether the set of addresses of the first read command is sequential with an address of the set of stream entries,
   wherein a stream entry in the set of stream entries is modified in response to determining that the set of addresses of the read command is sequential with an address of the stream entry.

3. The method of claim 2, wherein modifying the stream entry includes modifying one or more of (1) a starting address of an active stream of read commands represented by the stream entry based on the set of addresses of the first read command, (2) an ending address of the active stream based on the set of addresses of the first read command, (3) a most recent command size based on the set of addresses of the first read command, (4) a direction of the active stream that indicates whether the host system is requesting progressively lower numerical addresses or higher numerical addresses, (5) a last modified indication corresponding to a time of modification of the stream entry, (6) a readahead cache allocation corresponding to an amount of space in the readahead cache allocated to the active stream, or (7) a command count corresponding to a number of read commands represented by the active stream.

4. The method of claim 2, wherein determining whether the first read command is part of an active stream of read commands further comprises:
   determining whether the set of addresses of the first read command are sequential with an address of the set of command entries in response to determining that the set of addresses of the read command are nonsequential with an address of the set of stream entries; and
   adding a new stream entry to the set of stream entries in response to determining that the set of addresses of the first read command are sequential with an address of a command entry in the set of command entries corresponding to a second read command, wherein the new stream entry represents the first read command and the second read command as an active stream of read commands.

5. The method of claim 4, further comprising:
   adding a command entry to the command history table for the first read command in response to determining that the set of addresses of the first read command are nonsequential with addresses of the set of command entries.

6. The method of claim 1, further comprising:
   allocating space in the readahead cache per stream entry in the set of stream entries; and
   populating the readahead cache per stream entry in the set of stream entries based on the allocated space in the readahead cache.

7. The method of claim 6, wherein allocating the readahead cache per stream entry in the set of stream entries is based on one or more of (1) a most recent command size, which indicates a number of addresses in a read command that most recently modified a corresponding stream entry or (2) a command count that indicates a number of read commands represented by the corresponding stream entry.

8. The method of claim 6, wherein allocating space in the readahead cache comprises:
   determining an allocation request for each stream entry in the set of stream entries;
   determining whether the allocation requests are requesting more space than a size of the readahead cache; and
   adjusting the allocation requests per a policy of the memory subsystem.

9. The method of claim 8, wherein the policy includes one of (1) a fairness policy that allocates equal space in the readahead cache to each stream entry in the set of stream entries, (2) a large stream preference policy that allocates more space to larger stream entries than to smaller stream entries, or (3) a small stream preference policy that allocates more space to smaller stream entries than to larger stream entries.

10. A system comprising:
a readahead cache;
a memory component; and
a processing device, coupled to the memory component and the readahead cache, configured to:
determine an allocation of space in the readahead cache for each active stream of read commands represented in an active stream table, wherein the active stream table includes a set of stream entries and each stream entry in the set of stream entries represents a separate active stream of read commands, wherein as a first read command is received by the system, a first set of addresses of the first read command is compared with a second set of addresses of a stream entry in the set of stream entries to determine whether the first set of addresses of the first read command is sequential with the second set of addresses of the stream entry such that when the first set of addresses are sequential with the second set of addresses, the second set of addresses of the stream entry is modified to include the first set of addresses and when the first set of addresses are not sequential with the second set of addresses the first read command is added to a command history table;
populate the readahead cache with data from the memory component based on the allocation to each stream entry in the set of stream entries; and
attempt to fulfill a second read command based on the data stored in the readahead cache.

11. The system of claim 10, wherein the determining the allocation of space in the readahead cache for each active stream of read commands represented in the active stream table is based on one or more of (1) a most recent command size, which indicates a number of addresses in a read command that most recently modified a corresponding active stream or (2) a command count that indicates a number of read commands represented by the corresponding active stream.

12. The system of claim 10, wherein the determining the allocation of space in the readahead cache for each active stream of read commands represented in the active stream table comprises:
determining an allocation request for each active stream of read commands represented in the active stream table;
determining whether the allocation requests are requesting more space than a size of the readahead cache; and
adjusting the allocation requests per a policy of the system.

13. The system of claim 12, wherein the policy includes one of (1) a fairness policy that allocates equal space in the readahead cache to each of the active streams, (2) a large stream preference policy that allocates more space to larger active streams than to smaller active streams, or (3) a small stream preference policy that allocates more space to smaller active streams than to larger active streams.

14. A non-transitory computer-readable storage medium comprising instructions that, when executed by a processing device, cause the processing device to:
receive, from a host system, a first read command that requests data from a memory component of a memory subsystem;
determine whether the first read command is part of an active stream of read commands based on a comparison of a set of addresses of the first read command with (1) a command history table, which stores a set of command entries that each correspond to a received read command that has not been associated with an active stream of read commands, and (2) an active stream table, which stores a set of stream entries that each corresponds to active streams of read commands detected by the memory subsystem; and
modify a stream entry in the set of stream entries in response to determining that the first read command is part of an active stream of read commands being tracked with the stream entry in the active stream table.

15. The non-transitory computer-readable medium of claim 14, wherein determining whether the first read command is part of an active stream of read commands comprises:
determining whether the set of addresses of the first read command is sequential with an address of the set of stream entries,
wherein a stream entry in the set of stream entries is modified in response to determining that the set of addresses of the read command is sequential with an address of the stream entry.

16. The non-transitory computer-readable medium of claim 15, wherein modifying the stream entry includes modifying one or more of (1) a starting address of an active stream of read commands represented by the stream entry based on the set of addresses of the first read command, (2) an ending address of the active stream based on the set of addresses of the first read command, (3) a most recent command size based on the set of addresses of the first read command, (4) a direction of the active stream that indicates whether the host system is requesting progressively lower numerical addresses or higher numerical addresses, (5) a last modified indication corresponding to a time of modification of the stream entry, (6) a readahead cache allocation corresponding to an amount of space in a readahead cache allocated to the active stream, or (7) a command count corresponding to a number of read commands represented by the active stream.

17. The non-transitory computer-readable medium of claim 15, wherein determining whether the first read command is part of an active stream of read commands further comprises:
determining whether the set of addresses of the first read command are sequential with an address of the set of command entries in response to determining that the set of addresses of the read command are nonsequential with an address of the set of stream entries; and
adding a new stream entry to the set of stream entries in response to determining that the set of addresses of the first read command are sequential with an address of a command entry in the set of command entries corresponding to a second read command, wherein the new stream entry represents the first read command and the second read command as an active stream of read commands.

18. The non-transitory computer-readable medium of claim 17, wherein the instructions further cause the processing device to:
add a command entry to the command history table for the first read command in response to determining that the set of addresses of the first read command are nonsequential with addresses of the set of command entries.

19. The non-transitory computer-readable medium of claim 14, wherein the instructions further cause the processing device to:

allocate space in a readahead cache per stream entry in the set of stream entries; and populate the readahead cache per stream entry in the set of stream entries based on the allocated space in the readahead cache, wherein allocating the readahead cache per stream entry in the set of stream entries is based on one or more of (1) a most recent command size, which indicates a number of addresses in a read command that most recently modified a corresponding stream entry or (2) a command count that indicates a number of read commands represented by the corresponding stream entry.

20. The non-transitory computer-readable medium of claim 19, wherein allocating space in the readahead cache comprises:

determining an allocation request for each stream entry in the set of stream entries;

determining whether the allocation requests are requesting more space than a size of the readahead cache; and adjusting the allocation requests per a policy of the memory subsystem, wherein the policy includes one of (1) a fairness policy that allocates equal space in the readahead cache to each stream entry in the set of stream entries, (2) a large stream preference policy that allocates more space to larger stream entries than to smaller stream entries, and (3) a small stream preference policy that allocates more space to smaller stream entries than to larger stream entries.

* * * * *